United States Patent [19] [11] Patent Number: 5,980,026
Imamura et al. [45] Date of Patent: *Nov. 9, 1999

[54] PROCESS FOR PRODUCTION OF INK JET HEAD

[75] Inventors: Isao Imamura, Kawasaki; Akihiko Shimomura, Yokohama, both of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/662,122

[22] Filed: Jun. 12, 1996

[30] Foreign Application Priority Data

Jun. 14, 1995 [JP] Japan .................................. 7-147457

[51] Int. Cl.⁶ .................................. B41J 2/05; G03C 5/00
[52] U.S. Cl. .......................... 347/65; 430/320; 430/327; 29/890.1
[58] Field of Search .................................. 430/320, 327; 29/890.1; 347/20, 44, 65

[56] References Cited

U.S. PATENT DOCUMENTS 4,401,733  8/1983  Shirai et al. ............................ 429/174
4,727,012  2/1988  Quella et al. ............................ 430/320
5,305,018  4/1994  Schantz et al. ........................... 346/1.1
5,458,254  10/1995 Miyagawa et al. ....................... 216/27
5,510,818  4/1996  Shimomura et al. ..................... 347/65
5,524,784  6/1996  Shiba et al. ............................. 216/27
5,539,982  7/1996  Hosono et al. ........................ 29/890.1

FOREIGN PATENT DOCUMENTS 0 432 795  6/1991  European Pat. Off. ......... C08L 63/00
0 658 430  6/1995  European Pat. Off. ........... B41J 2/16

*Primary Examiner*—Nam Nguyen
*Assistant Examiner*—Steven H. VerSteeg
*Attorney, Agent, or Firm*—Fitzpatrick, Cella, Harper & Scinto

[57] ABSTRACT

A process for producing an ink jet head comprises the steps of providing a substrate provided with a liquid discharge energy-generating portion, forming a photosensitive resin layer on the substrate, patterning the photosensitive resin layer into a liquid flow path pattern to form a solid layer for forming a liquid flow path on the substrate, covering the solid layer with a liquid flow path wall construction material composed of a curable resin on the substrate, curing the liquid flow path wall construction material, and removing the solid layer by dissolution to form a liquid flow path, wherein the liquid flow path wall construction material comprises an epoxy resin composition containing an epoxy addition-modified aromatic amine curing agent.

9 Claims, 2 Drawing Sheets

PROCESS FOR PRODUCTION OF INK JET HEAD

BACKGROUND OF THE INVENTION

1. Field of the Invention

The present invention relates to a process for production of an ink jet head for forming ink droplets in an ink jet printing system.

2. Related Background Art

An ink jet head for an ink jet printing system (liquid discharge recording system) generally comprises a fine discharge opening (hereinafter occasionally referred to as an "orifice"), a liquid flow path communicating to the discharge opening, and an energy-generating portion positioned in the liquid flow path.

Such an ink jet head can be produced, for example, through the steps comprising: forming a photosensitive resin layer 2 on a substrate 1 on which a liquid discharge energy-generating portion 3 has been provided (FIG. 1A); patterning, by photolithography, the photosensitive resin layer 2 as a pattern 4 (hereinafter referred to as a "solid layer") for forming a liquid flow path on the substrate (FIG. 1B and FIG. 1C); covering the solid layer on the substrate with a liquid flow path wall construction material 5 composed of a curable resin, and curing this material 5 (FIG. 1D); and removing the aforementioned solid layer by dissolution by use of an organic solvent such as halogen-containing hydrocarbons, ketones, esters, and alcohols, or an aqueous alkali solution of sodium hydroxide or potassium hydroxide to form a liquid flow path 6 (FIG. 1E).

In recent years, with the demand for higher image quality, a larger number of the liquid flow paths are provided in a high density in the ink head. With the increased liquid flow path density, a liquid chamber for feeding the ink to the liquid flow paths should have a sufficient volume to supply the ink to the liquid flow paths at a high rate. To secure the sufficient volume of the liquid chamber, the aforementioned liquid flow path wall is formed higher. Conventionally, the liquid flow path wall is formed from a photosetting epoxy resin composition because of its high rigidity after curing, and its relatively high adhesiveness. However, for the larger thickness of the liquid flow path wall construction material as mentioned above, the light exposure conditions for the photosetting are severer, and may occasionally cause insufficient cure of the resin owing to insufficiency of light exposure.

Therefore, the inventors of the present invention tried to change the material for the liquid flow path construction from the conventional photosetting type epoxy resin composition to a thermosetting type one. A curing agent for thermosetting of an epoxy resin includes acid anhydride type and amine type of curing agents. On the other hand, the aforementioned solid layer is usually formed from a positive type resist containing naphthoquinone diazide. This type of resist is less heat-resistant, and will be deformed when the epoxy resin for the liquid flow path wall construction is cured with a curing agent such as an acid anhydride or an aromatic amine which requires a higher curing temperature of from 130 to 150° C. Accordingly, as the curing agent for the epoxy resin, a cold cure type of amine curing agent is used which can cause cure at a relatively low temperature. However, the epoxy resin composition cured by cold cure to form the liquid flow path wall has generally a relatively low chemical resistance in comparison with the one formed by hot cure, and tends to swell greatly in the step of removal of the solid layer by a polar solvent (organic solvent) such as ketones, alcohols, and esters as a solid layer-removing liquid. The swelling of the liquid flow path wall construction material lengthens the time for removal of the solid layer, and lowers the productivity of the ink jet head.

Generally, the epoxy resin composition has high elasticity, which causes accumulation of high stress between the liquid flow path wall construction material and the substrate. The swelling of the liquid flow path wall construction material increases further the above stress to cause, in an extreme case, separation of the liquid flow path wall construction material from the substrate. In particular, in ink jet heads having liquid flow paths in a high density, the swelling becomes remarkable owing to fineness of the liquid flow path and the resulting long time of dissolution removal of the solid layer.

The requirement for the ink performance has become severer lately because of demands for higher image quality recorded by an ink jet printing system. For improvement of the ink, urea is incorporated in the ink as a humectant. Further, for improvement of water-resistance of the recorded matter, a slightly water-soluble dye is used as a coloring agent, and an alkali salt is incorporated in the ink to dissolve the dye. The ink containing urea or an alkali salt is relatively highly alkaline, which tends to swell the liquid flow path wall construction material similarly as the polar solvent. Accordingly, the conventional ink jet head produced by the above-mentioned process is liable to have the liquid flow path deformed by swelling due to the highly alkaline ink and thus to result in unsatisfactory liquid discharge, or is liable to cause separation of the liquid flow path wall construction material from the substrate, thus being not satisfactory in reliability of the ink jet head. As described above, the conventional production process for the ink jet head involves the technical problem of the swelling of the liquid flow path wall construction material by a polar solvent for removal of the solid layer or by a highly alkaline ink.

After comprehensive investigation of the thermosetting type epoxy resin composition as the liquid flow path wall construction material of the ink jet head, it was found by the inventors of the present invention that the above problem can be solved by use of a specific curing agent and a specific catalyst for the epoxy resin base material.

SUMMARY OF THE INVENTION

An object of the present invention is to provide a process for producing an ink jet head where a liquid flow path wall is formed from a material which is swollen less by a polar solvent for dissolution removal in the head production process, or by a highly alkaline ink.

Another object of the present invention is to provide a process for producing an ink jet head in which the production time can be shortened without taking a long time for dissolving a solid layer even by use of a polar solvent as the dissolving solvent.

Still another object of the present invention is to provide a process for producing an ink jet head in which a liquid flow path wall is formed from a material which will not separate from the substrate even when it is brought into contact with a polar solvent for dissolution removal in the head production process, or with a highly alkaline ink.

A further object of the present invention is to provide a process for producing an ink jet head which will not be swollen by a highly alkaline ink without causing deformation of the liquid flow path, and which will keep a desired liquid discharge state.

A still further object of the present invention is to provide an ink jet head produced by the process.

The process for producing an ink jet head of the present invention comprises the steps of providing a substrate provided with a liquid discharge energy-generating portion, forming a photosensitive resin layer on the substrate, patterning the photosensitive resin layer into a liquid flow path pattern to form a solid layer for forming a liquid flow path on the substrate, covering the solid layer with a liquid flow path wall construction material composed of a curable resin on the substrate, curing the liquid flow path wall construction material, and removing the solid layer by dissolution to form a liquid flow path, wherein the liquid flow path wall construction material comprises an epoxy resin composition containing an epoxy addition-modified aromatic amine curing agent.

According to the present invention, an ink jet head is produced which will not cause separation of the liquid flow path wall construction material from the substrate, and will not cause deformation of the liquid flow path, even when the liquid flow path wall construction material is brought into contact with a polar solvent for removal of the solid layer or with a highly alkaline ink, to maintain a satisfactory liquid discharge state.

DESCRIPTION OF THE PREFERRED EMBODIMENTS

The process of the present invention is described below for the respective steps successively in detail by reference to drawings. FIGS. 2A to 2F illustrate a basic production process of the present invention. Although the ink jet head in the figures have three discharge openings (orifices) for illustration, the process is similar in production of a high density multi-array ink jet head having more discharge openings.

Figure 1A:
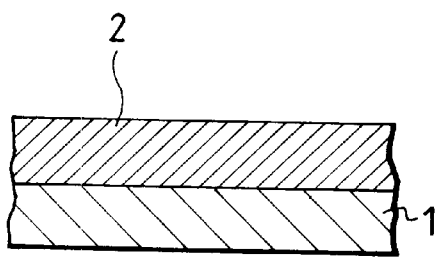
FIGS. 1A to 1E illustrate a conventional process for producing an ink jet head.
Figure 1B:
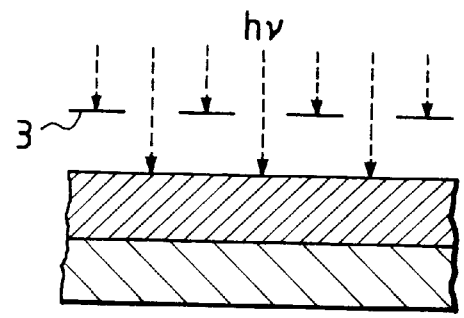
Figure 1C:
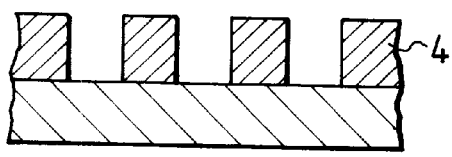
Figure 1D:
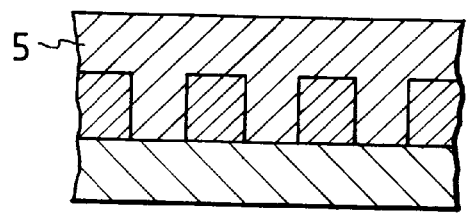
Figure 1E:
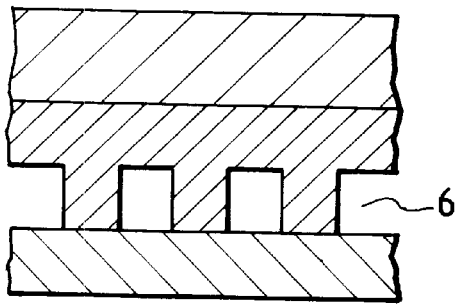
Figure 2A:
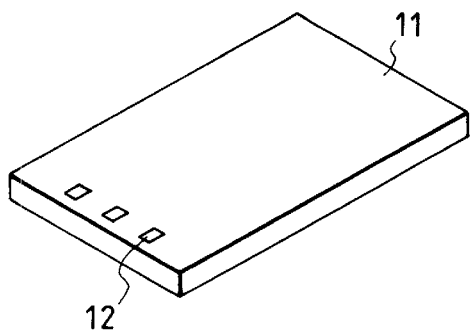
FIGS. 2A to 2F illustrate a process for producing an ink jet head of the present invention.

(1) FIG. 2A is a schematic perspective view of a substrate of this embodiment of the present invention. In this embodiment, a substrate 11 as shown in FIG. 2A is used which is composed of glass, a ceramic material, a plastic material, or a metal. The substrate 11 may be in any shape and of any material provided that it can serve as a portion of the liquid flow path and as a supporting member for the liquid flow path wall construction material described later. On the substrate 11, discharge energy-generating elements 12 such as electrothermal converting elements and piezoelectric elements are provided in a necessary number on the substrate 11 (three elements in FIG. 2A). These discharge energy-generating elements 12 give discharge energy to the ink for discharging the printing liquid droplets to conduct printing. For example, an electrothermal converting element as the discharge energy-generating element 12 heats the printing liquid in the vicinity thereof to generate the discharge energy. The discharge energy-generating elements 12 are connected respectively to a control signal input electrode (not shown in the drawing) for operating the elements. On the discharge energy-generating elements 12, a functional layer such as a protection layer may be provided also in the present invention as in conventional elements to improve durability.

Figure 2B:
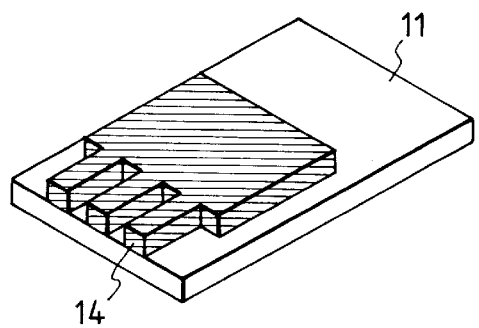

(2) In the second step, a photosensitive resin layer is formed on the substrate 11 provided with the liquid discharge energy-generating element 12. The photosensitive resin layer can be formed, for example, by dissolving the photosensitive resin in a solvent, applying the solution onto a film such as a PET film and drying the applied resin to form a dry film, and transferring the film onto the substrate by means of a laminator. Otherwise, the layer may be formed by conventional spin coating, or roll coating. A suitable material for the photosensitive resin layer is a naphthoquinone diazide type of positive photosensitive resin. The photosensitive resin layer is exposed to light in a pattern to form a first solid layer 14 in the liquid flow path pattern. The photosensitive resin layer pattern itself becomes the liquid flow path in the later step (FIG. 2B).

Figure 2C:
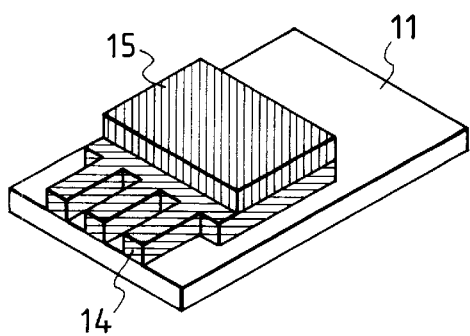

(3) In the third step, a second solid layer 15 composed of a soluble solder resist is formed in a liquid chamber pattern on the first solid layer 14 by screen printing or a like method (FIG. 2C).

Figure 2D:
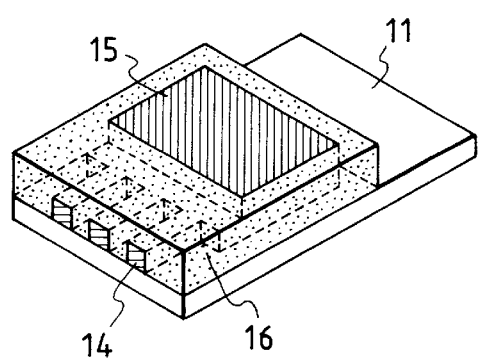

(4) In the fourth step, a liquid flow path wall construction material 16 is provided on the first solid layer 14 and the second solid layer 15 as shown in FIG. 2D. The liquid flow path wall construction material 16, which becomes the construction material of the ink jet head, is required to have high mechanical strength, high heat resistance, high adhesiveness to the substrate, high resistance to the liquid ink, and so forth. For satisfying the required properties, an epoxy resin composition is employed in the present invention. This epoxy resin composition is a curable resin composition composed mainly of an epoxy resin as the base material and a curing agent, and may contain a curing catalyst, a silane coupling agent, or the like, as desired. The epoxy resin as the base material is preferably a polyfunctional epoxy resin having two or more epoxy groups in the molecule. The epoxy resin is specifically exemplified by a bisphenol A type, a bisphenol F type, a bisphenol AD type, a phenol novolak type, a cresol novolak type, an alicyclic type, an aliphatic type, a naphthalene skeleton type, and a biphenyl type of epoxy resins.

The curing agent in the epoxy resin composition of the present invention is an epoxy addition-modified aromatic amine curing agent. This curing agent, which is capable of curing at an ordinary temperature, does not cause deformation of the solid layer during cure of the epoxy resin composition. Moreover, the resin cured by this curing agent has less cure shrinkage than conventional amine type curing agents which are used, giving no stress accumulation without separation of the epoxy resin from the substrate. The epoxy resin cured by the curing agent has high water resistance and high ink resistance, and is capable of retaining the desired discharge properties after removal of the solid layer with a polar solvent and when in contact with a highly alkaline ink. Thus an ink jet head can be provided with high reliability in the present invention.

The epoxy addition-modified aromatic amine curing agent can be formed by reacting an aromatic amine such as metaphenylenediamine, diaminodiphenylmethane and diaminodiphenyl sulfone, etc. with an epoxy resin such as glycidyl ether, etc. The reaction formula is shown below.

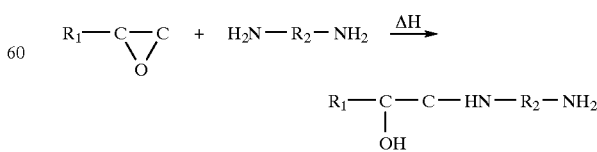

The curing agents on the market are, for example, Fuji Cure 6010 and 6300 (trade names, produced by Fuji Kasei Kogyo K. K.). Fuji Cure 6010 is butylglycidyl ether adduct of 4,4'-diaminodiphenylmethane.

The epoxy resin cured by the epoxy addition-modified aromatic amine curing agent in the present invention is not substantially free from swelling by the highly alkaline ink, although the swelling is remarkably reduced. To improve further the water-resistance and the ink-resistance of the epoxy resin composition for the liquid flow path wall construction material, a curing catalyst is preferably incorporated in the composition.

The curing catalyst used in the present invention is preferably a cationic polymerization type. The cationic polymerization type of catalyst increases greatly the crosslinking density of the cured product, and increases further the water-resistance of the epoxy resin composition. The cationic polymerization type catalysts are classified generally into a Brønsted acid-forming type and a Lewis acid-forming type. The Brønsted acid-forming type cannot be used in combination with an amine type curing agent since it is inhibited in curing by a strongly basic substance (nitrogen-containing compounds, and the like). Therefore, the cationic polymerization type curing agent is limited to a Lewis acid-forming type curing agents in the present invention. The Lewis acid-forming type curing agents include boron trifluoride-amine complexes such as boron trifluoride-dibutylamine complex, boron trifluoride-aniline complex, boron trifluoride-isopropylamine complex, and boron trifluoride-benzylamine complex.

The liquid flow path wall construction material 16 can be provided by solvent coating of a solution of the resin in a solvent.

Figure 2E:
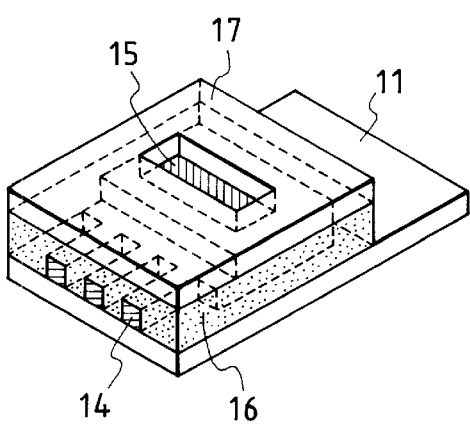

(5) In the fifth step, a cover plate 17 provided with an ink supplying opening is bonded onto the liquid flow path wall construction material (FIG. 2E).

Figure 2F:
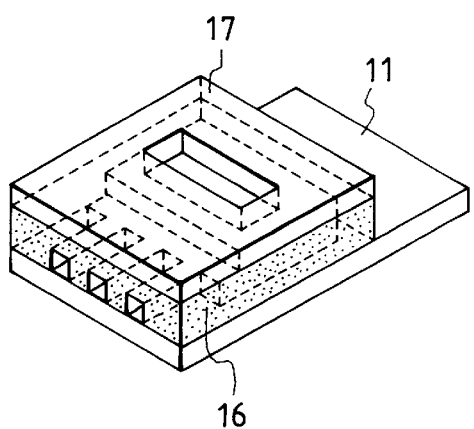

(6) In the final step, as shown in FIG. 2F, the first solid layer 14 and the second solid layer 15 are removed by dissolution by use of an organic solvent such as halogen-containing hydrocarbons, ketones, esters, and alcohols; or an aqueous solution of alkali such as sodium hydroxide, and potassium hydroxide to form a liquid flow path.

In the above description, an edge-shooter type ink jet head is explained. The present invention can also be applied to a side-shooter type ink jet head.

The present invention gives excellent effects in a recording head particularly for bubble jet system among liquid ejection recording systems.

The present invention is also effective for a full-line type recording head which conducts recording simultaneously over the entire width of the recording paper sheet, and a color recording head which is constructed by integration or combination of plural recording heads.

The recording head according to the present invention is applicable not only for a liquid ink but also for a solid ink which is liquefied above a certain temperature, or becomes liquid on application of a recording signal.

The effects of the present invention were confirmed by preparing and evaluating the ink jet heads in Examples 1 to 10. Of Examples 1 to 10, Examples 1, 2, 6 to 9 relate to the ink jet head of the present invention.

EXAMPLE 1

A positive type resist, PMER AR-900 (trade name, produced by Tokyo Ohka Kogyo Co., Ltd.) was applied in a thickness of 50 μm on a silicon substrate provided with an electrothermal transducer as a discharge energy-generating elements thereon. The positive type resist was patterned into a discharge opening pattern to form a first solid layer. Thereon, a soluble solder resist is applied by screen printing in a liquid chamber pattern in a thickness of 100 μm as a second solid layer. Further, an epoxy resin composition, shown in Table 1, Example 1, was applied in a thickness of 150 μm as a liquid flow path wall construction material to cover the first and second solid layers on the substrate. The covered substrate was left standing at room temperature for 30 hours, and heat-treated at 130° C. for one hour to cure the epoxy resin composition. A glass cover plate was bonded onto the liquid flow path wall construction material. Then the first and second solid layers were removed by dissolution by use of bis(2-ethoxyethyl) ether. The formed product was treated at 130° C. for one hour for drying and thermal treatment to obtain an ink jet head.

EXAMPLE 2

An ink jet head was prepared in the same manner as in Example 1 except that the epoxy resin composition was replaced by the one shown in Table 1, Example 2.

EXAMPLE 3

An ink jet head was prepared in the same manner as in Example 1 except that the epoxy resin composition was replaced by the one shown in Table 1, Example 3.

EXAMPLE 4

An ink jet head was prepared in the same manner as in Example 1 except that the epoxy resin composition was replaced by the one shown in Table 1, Example 4.

EXAMPLE 5

An ink jet head was prepared in the same manner as in Example 1 except that the epoxy resin composition was replaced by the one shown in Table 1, Example 5, and the curing condition of the liquid flow path wall construction material was changed to 130° C. for 2 hours.

EXAMPLE 6

An ink jet head was prepared in the same manner as in Example 1 except that the epoxy resin composition was replaced by the one shown in Table 1, Example 6.

EXAMPLE 7

An ink jet head was prepared in the same manner as in Example 1 except that the epoxy resin composition was replaced by the one shown in Table 1, Example 7.

EXAMPLE 8

An ink jet head was prepared in the same manner as in Example 1 except that the epoxy resin composition was replaced by the one shown in Table 1, Example 8.

EXAMPLE 9

An ink jet head was prepared in the same manner as in Example 1 except that the epoxy resin composition was replaced by the one shown in Table 1, Example 9.

EXAMPLE 10

An ink jet head was prepared in the same manner as in Example 1 except that the epoxy resin composition was replaced by the one shown in Table 1, Example 10.

The ink jet heads prepared in Examples 1 to 10 were subjected to a heat cycle test in which a sequence of treatments of −30° C. for 2 hours, room temperature for 2 hours, and 60° C. for 2 hours is repeated 10 times. After the heat cycle test, the respective heads were examined. Those which caused neither warpage nor separation were evaluated as "Good", and those which caused warpage or separation were evaluated as "Poor". The results are shown in Table 1.

In the heat cycle test, the ink jet heads prepared in Examples 1, 2, and 6 to 9 did not cause any abnormality, while the ink jet heads prepared in Examples 3 and 10 caused separation of the liquid flow path wall construction material from the substrate. The ink jet head prepared in Example 5 did not have a desired shape of the liquid flow path, which results probably from deformation (or melting) of the solid layer in the step of hot curing of the liquid flow path wall construction material. The ink jet head prepared in Example 4 did not cause separation of the liquid flow path wall construction material from the substrate, but the head itself came to be warped (or curved), probably owing to large cure shrinkage of the liquid flow path wall construction material.

In the ink immersion test, the ink jet heads prepared in Examples 1 and 2 did not cause separation, but caused slight swelling. The ink jet heads prepared in Examples 6 to 9 caused neither separation nor swelling, probably because of the higher crosslinking density resulting from the addition of the curing catalyst. The ink jet heads prepared in Examples 3 to 5, and 10 caused separation of the liquid flow path wall construction material from the substrate, probably because of the stress built up by swelling of the liquid flow path wall construction material by the highly alkaline ink.

The ink jet heads prepared in Examples 1, 2, and 6 to 9 were subjected to printing tests by use of the aforementioned highly alkaline ink, and were confirmed to form printed images of high quality without image disturbance.

As shown above, in Examples of the present invention, reliable ink jet recording heads were produced without significant swelling of the liquid flow path wall construction material.

TABLE 1

| Example No. | 1 | 2 | 3 | 4 | 5 | 6 | 7 | 8 | 9 | 10 |
| --- | --- | --- | --- | --- | --- | --- | --- | --- | --- | --- |
| Base resin | | | | | | | | | | |
| Adeka Optomer KRM2410 *1 (Bisphenol A type) | 95.3 | | 95.3 | 95.3 | 95.3 | 95.3 | | 95.3 | | 95.3 |
| R710 *2 (Bisphenol AD type) | | 95.3 | | | | | 95.3 | | 95.3 | |
| Curing agent | | | | | | | | | | |
| Fuji Cure 6010 *3 (Epoxy addition-modified aromatic amine) | 50 | | | | | | 49.5 | 49.5 | | |
| Fuji Cure 6300 *3 (Epoxy addition-modified aromatic amine) | | 50 | | | | | | | 49.5 | 49.5 |
| Fuji Cure FXK830 *3 (Modified aliphatic amine) | | | 50 | | | | | | | 49.5 |
| Triethylenetetramine TTA *4 (Amine) | | | | 10 | | | | | | |
| Diaminodiphenylmethane DDM *5 (Aromatic amine) | | | | | 20 | | | | | |
| Curing catalyst | | | | | | | | | | |
| Anckor 1171 *6 (Boron trifluoride-aniline complex) | | | | | | 0.5 | 0.5 | | | 0.5 |
| Anchor 1222 *6 (Boron trifluoride-dibutylamine complex) | | | | | | | | 0.5 | | |
| Anchor 1115 *6 (Boron trifluoride-isopropylamine complex) | | | | | | | | | 0.5 | |
| A 187 *7 (Silane coupling agent) | 4.7 | 4.7 | 4.7 | 4.7 | 4.7 | 4.7 | 4.7 | 4.7 | 4.7 | 4.7 |
| Heat cycle test | Good | Good | Poor | Poor | Poor | Good | Good | Good | Good | Poor |
| Ink immersion test | Good | Good | Poor | Poor | Poor | Excnt | Excnt | Excnt | Excnt | Poor |

*1 Trade name, Asahi Denka Kogyo K.K.,
*2 Trade name, Mitsui Sekiyu Kagaku K.K.
*3 Trade name, Fuji Kasei Kogyo K.K.,
*4 Trade name, Kanto Denka Kogyo K.K.
*5 Trade name, Yuka Shell Epoxy K.K.,
*6 Trade name, Air Products and Chemicals Co.
*7 Trade name, Nippon Unicar Co., Ltd.

The ink jet heads prepared in Examples 1 to 10 were further subjected to an ink immersion test (PCT) to test the effect of the swelling of the liquid flow path wall construction material by ink. The ink immersion test was conducted with a highly alkaline ink of pH 10.7 having a composition of GLY 10.0, UREA 5.0, IPA 5.0, lithium hydroxide 0.4, and ammonium sulfate 0.5 at a temperature of 120° C., at a pressure of 2 atmospheres for 10 hours. After the ink immersion test, ink jet heads which caused neither separation nor swelling were evaluated as "Excnt (Excellent)"; ink jet heads which did not cause separation, but caused swelling were evaluated as "Good"; and ink jet heads which caused separation were evaluated as "Poor". The results are shown in Table 1.

What is claimed is:

1. A process for producing an ink jet head, comprising the steps of:

providing a substrate provided with a liquid discharge energy-generating portion, forming a photosensitive resin layer on the substrate, patterning the photosensitive resin layer into a liquid flow path pattern to form a solid layer for forming a liquid flow path on the substrate, covering the solid layer with a liquid flow path wall construction material composed of a curable resin on the substrate, curing the liquid flow path wall construction material, and removing the solid layer by dissolution to form a liquid flow path, wherein the liquid flow path wall construction material comprises an epoxy resin composition containing an epoxy addition-modified aromatic amine curing agent.

2. The process for producing an ink jet head according to claim 1, wherein the epoxy resin composition further contains a Lewis acid catalyst.

3. The process for producing an ink jet head according to claim 2, wherein the Lewis acid catalyst is a boron trifluoride-amine complex.

4. The process for producing an ink jet head according to claim 1, wherein the solid layer comprises a positive type photoresist containing naphthoquinone diazide.

5. The process for producing an ink jet head according to claim 1, wherein the solid layer is removed by dissolution with a polar solvent as a dissolution liquid.

6. An ink jet head produced by a production process comprising the steps of:

providing a substrate provided with a liquid discharge energy-generating portion, forming a photosensitive resin layer on the substrate, patterning the photosensitive resin layer into a liquid flow path pattern to form a solid layer for forming a liquid flow path on the substrate, covering the solid layer on the substrate with a liquid flow path wall construction material composed of an epoxy resin composition containing an epoxy addition-modified amine curing agent, curing the liquid flow path wall construction material, and removing the solid layer by dissolution to form a liquid flow path.

7. An ink jet head comprising:

a discharge opening for discharging ink;

a liquid flow path communicating to the discharge opening;

a liquid discharge energy-generating device disposed at a part of the liquid flow path; and a liquid flow path wall for forming the liquid flow path, wherein a material for forming the liquid flow path wall comprises an epoxy resin cured by an epoxy addition-modified aromatic amine curing agent.

8. An ink jet head according to claim 7, wherein the epoxy resin contains a Lewis acid catalyst.

9. An ink jet head according to claim 8, wherein the Lewis acid catalyst is a boron trifluoride-amine complex.

* * * * *

UNITED STATES PATENT AND TRADEMARK OFFICE
CERTIFICATE OF CORRECTION

PATENT NO.    : 5,980,026

DATED         : November 9, 1999

INVENTOR(S)   : ISAO IMAMURA, ET AL.

It is certified that error appears in the above-identified patent and that said Letters Patent is hereby corrected as shown below:

<u>COLUMN 6</u>:

Line 1, "elements" should read --element--.

Line 3, "is" should read --was--.

Signed and Sealed this

Twenty-eighth Day of November, 2000

Attest:

Q. TODD DICKINSON

*Attesting Officer*     *Director of Patents and Trademarks*